(12) United States Patent
Lee et al.

(10) Patent No.: US 7,521,357 B2
(45) Date of Patent: Apr. 21, 2009

(54) METHODS OF FORMING METAL WIRING IN SEMICONDUCTOR DEVICES USING ETCH STOP LAYERS

(75) Inventors: Sang-woo Lee, Seoul (KR); Gil-heyun Choi, Gyeonggi-do (KR); Sang-bom Kang, Seoul (KR); Jong-myeong Lee, Gyeonggi-do (KR); Jin-ho Park, Seoul (KR)

(73) Assignee: Samsung Electronics Co., Ltd. (KR)

( * ) Notice: Subject to any disclaimer, the term of this patent is extended or adjusted under 35 U.S.C. 154(b) by 397 days.

(21) Appl. No.: 11/063,936

(22) Filed: Feb. 23, 2005

(65) Prior Publication Data

US 2005/0184394 A1  Aug. 25, 2005

(30) Foreign Application Priority Data

Feb. 24, 2004  (KR) .................. 10-2004-0012200

(51) Int. Cl.
*H01L 21/4763* (2006.01)

(52) U.S. Cl. .................. 438/634; 438/637; 438/672; 257/E21.575

(58) Field of Classification Search .................. 257/758, 257/E21.575, E21.577, E21.578; 216/18; 438/634, 612, 622, 625, 636–637, 672, 675
See application file for complete search history.

(56) References Cited

U.S. PATENT DOCUMENTS

| | | | |
|---|---|---|---|
| 5,686,354 A * | 11/1997 | Avanzino et al. | 216/18 |
| 6,037,263 A | 3/2000 | Chang | |
| 6,133,144 A * | 10/2000 | Tsai et al. | 438/634 |
| 6,376,353 B1 * | 4/2002 | Zhou et al. | 438/612 |
| 6,787,906 B1 * | 9/2004 | Yang et al. | 257/758 |
| 2003/0044725 A1 * | 3/2003 | Hsue et al. | 430/314 |
| 2003/0057561 A1 * | 3/2003 | Fukuyama et al. | 257/774 |

FOREIGN PATENT DOCUMENTS

| | | |
|---|---|---|
| JP | 2000-040673 | 2/2000 |
| KR | 980060526 | 10/1998 |
| KR | 1019990059074 | 7/1999 |
| KR | 00248804 B1 | 12/1999 |
| KR | 100274603 | 9/2000 |
| KR | 1020000061705 | 10/2000 |
| KR | 1020020032168 | 5/2002 |
| KR | 1020030023286 | 3/2005 |

OTHER PUBLICATIONS

Notice to File a Response/Amendment to the Examination Report for Korean patent application 10-2003-0057264 mailed on Jul. 11, 2005.

* cited by examiner

*Primary Examiner*—Thanhha Pham
(74) *Attorney, Agent, or Firm*—Myers Bigel Sibley & Sajovec

(57) ABSTRACT

A method of forming a metal wiring in a semiconductor device can include forming an etch stop layer outside a contact hole formed in an insulation layer and avoiding forming the etch stop layer inside the contact hole. A conductive layer can be formed on the etch stop layer outside the contact hole and on an exposed conductive pattern inside the contact hole and on a sidewall of the contact hole and a metal layer can be formed on the conductive layer to fill the contact hole.

24 Claims, 14 Drawing Sheets

METHODS OF FORMING METAL WIRING IN SEMICONDUCTOR DEVICES USING ETCH STOP LAYERS

CROSS-REFERENCE TO RELATED APPLICATION

This application claims priority under 35 USC § 119 to Korean Patent Application No. 2004-0012200 filed on Feb. 24, 2004, the contents of which are incorporated by reference in its entirety.

FIELD OF THE INVENTION

The invention relates to semiconductor devices and more particularly, to methods of forming metal wirings in semiconductor devices and devices so formed.

BACKGROUND

It is known to reduce a design rule for semiconductor fabrication to increase the density of integrated circuits. It is further known to reduce the design rule for multi-layered wiring in semiconductor devices. When wiring has a multi-layered structure, a contact may be needed to electrically connect between layers. It is known to use polysilicon for a barrier metal layer and a contact plug in such applications. However, to reduce a resistance of a contact plug and also to employ a metal-insulator-metal (MIM) type capacitor in the semiconductor device, the polysilicon plug may need to be replaced with a metal plug.

It is known to form a barrier layer, including a titanium layer and a titanium nitride layer stacked thereon, on inner sides of a contact hole. The barrier layer is then thermally treated to form a titanium silicide layer. Tungsten is deposited on the barrier layer by a chemical vapor deposition (CVD) process to form a tungsten wiring.

The titanium silicide layer may reduce the contact resistance of a semiconductor device. However, as a junction depth becomes shallow due to a high degree of integration of the semiconductor device, a leakage current from the titanium siclide layer may increase.

To overcome the above-mentioned problems, a conventional method of forming a tungsten silicide layer is disclosed in Korean Patent Laid Open Publication No. 1998-60526. FIGS. 1A to 1C are cross sectional views illustrating the conventional method discussed in the above Korean Patent Laid Open Publication.

Referring to FIG. 1A, an insulation layer (not shown) is formed on a semiconductor substrate 10. The insulation layer is partially etched to form an insulation layer pattern 20 having a contact hole 25 that partially exposes the substrate 10. The substrate 10 is then cleaned to remove particles or etch residues in the contact hole 25. A preliminary tungsten nitride layer 30 having a thickness of about 50 Å to about 1,000 Å is formed on the insulation layer pattern 20 and the contact hole 25 by a CVD process.

Referring to FIG. 1B, a tungsten layer 40 is formed on the preliminary tungsten nitride layer 30 to fill the contact hole 25.

Referring to FIG. 1C, the substrate 10 is thermally treated at a temperature of about 600° C. to about 900° C. to form a tungsten silicide layer 32 and a tungsten nitride layer 34 between the substrate 10 and a portion of the tungsten layer 40 in the contact hole 25.

The tungsten layer 40 is then etched by a dry etching process to form tungsten wiring (not shown) in the contact hole 25. The tungsten wiring may reduce a contact resistance and also may reduce/prevent an increase of a leakage current.

As shown in FIG. 6, after the tungsten layer 40 is etched, a recess R having a deep depth is formed at an upper portion of the tungsten wiring, thereby causing a contact failure of a semiconductor device. In addition, the conventional tungsten wiring may be formed at a relatively high temperature. Thus, a thermal stress due to the deposition process at a high temperature may be generated in a pattern on the substrate 10 so that the pattern may be thermally damaged.

SUMMARY

Embodiments according to the invention can provide methods of forming a metal wiring in semiconductor devices using etch stop layers and devices so formed. Pursuant to these embodiments, a method of forming a metal wiring in a semiconductor device can include forming an etch stop layer outside a contact hole forming in an insulation layer and avoiding forming the etch stop layer inside the contact hole. A conductive layer can be formed on the etch stop layer outside the contact hole and on an exposed conductive pattern inside the contact hole and on a sidewall of the contact hole and a metal layer can be formed on the conductive layer to fill the contact.

In some embodiments according to the invention, forming an etch stop layer includes forming a titanium/titanium nitride layer, a titanium nitride layer, a tantalum/tantalum nitride layer, a tantalum nitride layer, a zirconium nitride layer and/or a hafnium nitride layer. In some embodiments according to the invention, forming an etch stop layer includes forming a Titanium Nitride layer and forming a conductive layer includes forming Tungsten layer.

In some embodiments according to the invention, forming an etch stop layer, forming a conductive layer and forming a metal layer are performed at a temperature of no more than about 450° Centigrade. In some embodiments according to the invention, forming an etch stop layer outside a contact hole in an insulation layer and avoiding forming the etch stop layer inside the contact hole further include forming the etch stop layer outside the contact hole and forming a portion of the etch stop layer inside the contact hole of a sidewall thereof proximate to an opening of the contact hole and avoiding forming the etch stop layer at a bottom of the contact hole. The portion of the etch stop layer is removed from inside the contact hole.

In some embodiments according to the invention, the method further includes removing the metal layer from the insulation layer to expose the etch stop layer and to leave a remaining portion of the etch stop layer on the insulation layer. In some embodiments according to the invention, the insulation layer is a first insulation layer, the etch stop layer is a first etch stop layer, the conductive layer is a first conductive layer, and the metal layer is a first metal layer. The method can further include forming a second insulation layer on the first metal layer having a pad hole formed therein exposing the first metal layer. A second etch stop layer is formed outside the pad hole and forming the second etch stop layer inside the pad hole is avoided. A second conductive layer is formed on the second etch stop layer outside the contact hole and on the exposed first metal layer inside the pad hole and on a sidewall of the pad hole. A second metal layer is formed on the second conductive layer to fill the pad hole.

In some embodiments according to the invention, the method further includes removing the second metal layer from the second insulation layer to expose the second etch stop layer and to leave a remaining portion of the second etch stop layer on the second insulation layer. In some embodiments according to the invention, forming a second etch stop layer includes forming a titanium/titanium nitride layer, a titanium nitride layer, a tantalum/tantalum nitride layer, a tantalum nitride layer, a zirconium nitride layer and/or a hafnium nitride layer.

In some embodiments according to the invention, forming a second etch stop layer, forming a second conductive layer and forming a second metal layer are performed at a temperature of no more than about 450° Centigrade. In some embodiments according to the invention, forming a conductive layer is a Tungsten layer. In some embodiments according to the invention, forming a titanium nitride layer includes providing a nitrogen gas to a titanium layer to nitride the titanium layer.

In some embodiments according to the invention a contact in a semiconductor device includes a tungsten layer in a contact hole formed in an insulating layer. A conductive layer is in the contact hole between the tungsten layer and a sidewall of the contact hole, the conductive layer being absent from a surface of the insulation layer outside the contact hole. An etch stop layer is on the surface of the insulation layer and absent from inside the contact hole.

In some embodiments according to the invention, the insulation layer is a first insulation layer, the etch stop layer is a first titanium nitride etch stop layer, the conductive layer is a first tungsten nitride layer, and the tungsten layer is a first tungsten layer. The contact further includes a second insulation layer on the first tungsten layer having a pad hole formed therein exposing the first tungsten layer. A second titanium nitride etch stop layer is outside the pad hole and is absent from inside the pad hole. A second tungsten nitride layer is on the second titanium nitride etch stop layer outside the contact hole and is on the exposed first tungsten layer inside the pad hole and on a sidewall of the pad hole. A tungsten layer is on the second tungsten nitride layer filling the pad hole.

Figure 1A:
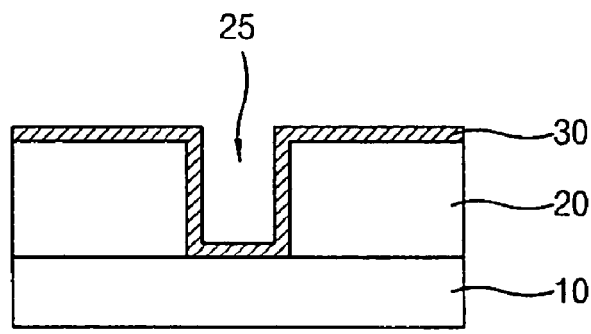
FIGS. 1A to 1C are cross sectional views illustrating a conventional method of forming a tungsten wiring of a semiconductor device.
Figure 1B:
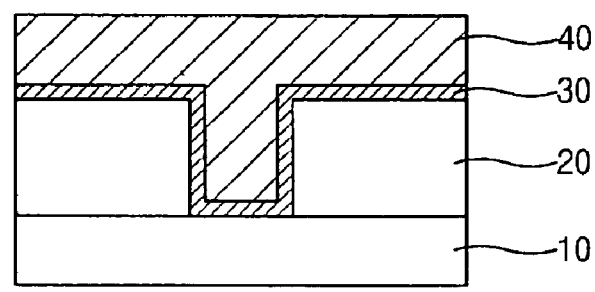
Figure 1C:
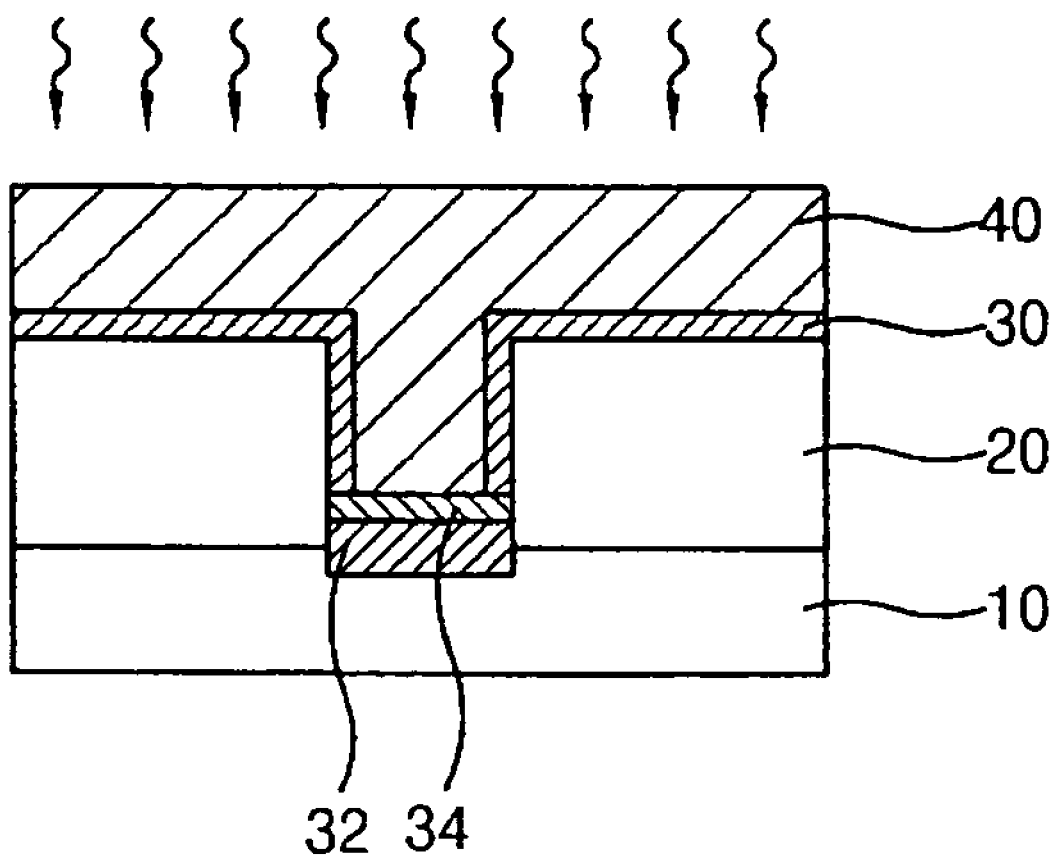

DESCRIPTION OF EMBODIMENTS
ACCORDING TO THE INVENTION

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. As used herein the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers refer to like elements throughout the specification.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Embodiments of the present invention are described herein with reference to cross-section (and/or plan view) illustrations that are schematic illustrations of idealized embodiments of the present invention. As such, variations from the shapes of the illustrations as a result, for example, of manufacturing techniques and/or tolerances, are to be expected.

Thus, embodiments of the present invention should not be construed as limited to the particular shapes of regions illustrated herein but are to include deviations in shapes that result, for example, from manufacturing. For example, an etched region illustrated or described as a rectangle will, typically, have rounded or curved features. Thus, the regions illustrated in the figures are schematic in nature and their shapes are not intended to illustrate the precise shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. It will also be appreciated by those of skill in the art that references to a structure or feature that is disposed "adjacent" another feature may have portions that overlap or underlie the adjacent feature.

Figure 2:
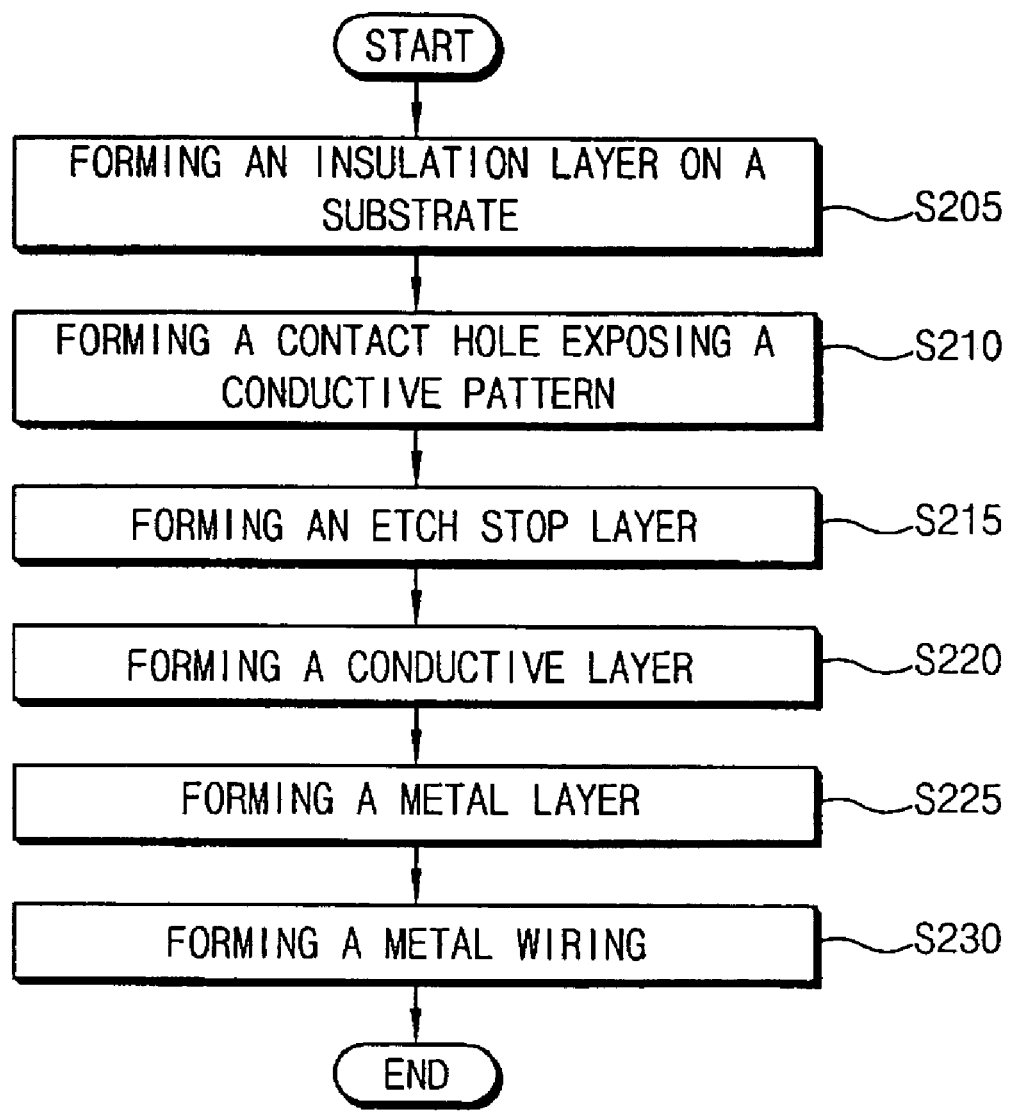
FIG. 2 is a flowchart illustrating methods of forming metal wiring in a semiconductor device according to some embodiments of the invention.

FIG. 2 is a flowchart illustrating methods of forming a metal wiring in a semiconductor device according to some embodiments of the invention. Referring to FIG. 2, an insulation layer is formed on a semiconductor substrate having a conductive pattern formed thereon (block 205). The semiconductor substrate is divided into an active region and a field region by an isolation process such as a shallow trench isolation (STI) process. A transistor including a gate electrode, source/drain regions and a nitride spacer is formed on the semiconductor substrate. The conductive pattern may include a metal silicide layer and/or metal wiring formed on the source/drain regions and the gate electrode. The insulation layer may be a material having a low dielectric constant such as $SiO_2$, SiON, siloxane SOG, silicate SOG, PSG, PEOX, P-TEOS, USG, FSG, HSG, SiLK, etc.

A contact hole is formed through the insulation layer to expose the conductive pattern (block 210). In particular, a photoresist pattern having an opening for exposing the conductive pattern is formed on the insulation layer. The insulation layer is anisotropically etched using the photoresist pattern as an etching mask so that the contact hole is formed through the insulation layer. The photoresist pattern is then removed from the insulation layer by an ashing process and/or a stripping process.

An etch stop layer is formed on the insulation layer outside the contact hole whereas formation of the etch stop layer inside the contact hole is avoided (block 215). In some embodiments according to the invention, the etch stop layer includes titanium/titanium nitride (Ti/TiN), titanium nitride (TiN), tantalum/tantalum nitride (Ta/TaN), tantalum nitride (TaN), zirconium nitride (ZrN), hafnium nitride (HfN), etc. In some embodiments according to the invention, the etch stop layer has a thickness of no more than about 100 Å and is formed by a sputtering process.

In some embodiments according to the invention, the etch stop layer is formed by forming a metal layer on the insulation layer to a thickness of no more than about 100 Å using a CVD process or a sputtering process. The metal layer may be thermally treated in-situ or ex-situ in a chamber where a nitrogen ($N_2$) gas or an ammonia ($NH_3$) gas is introduced. Thus, the metal layer is changed into a metal nitride layer to thereby form the etch stop layer.

A conductive layer is uniformly formed on a sidewall and a bottom face of the contact hole and on the etch stop layer outside the contact hole (block 220). In some embodiments according to the invention, the conductive layer includes tungsten nitride (WN), tungsten/tungsten nitride (W/WN), etc. The conductive layer may be formed by a CVD process or an atomic layer deposition (ALD) process at a low temperature. In some embodiments according to the invention, the conductive layer is formed by the ALD process at a temperature of no more than about 450° Centigrade to a thickness of no more than about 100 Å., which may reduce/prevent thermal stress. When the conductive layer is formed using the above-disclosed processing conditions, thermal damage to the device may be reduced.

Meanwhile, the conductive layer can reduce/prevent tungsten ions in metal wiring in the contact hole from diffusing into the insulation layer. The conductive layer may also improve adhesion between the insulation layer and the tungsten wiring.

A metal layer is formed on the conductive layer to fill the contact hole (block 225). In some embodiments according to the invention, the metal layer is formed on the conductive layer using CVD or physical vapor deposition (PVD) to fill the contact hole without voids. In some embodiments according to the invention, the metal layer includes tungsten and/or aluminum. In some embodiments according to the invention, the metal layer is formed at a temperature of no more than about 500° C.

The metal layer dry etched to expose a surface of the etch stop layer so that the metal wiring including tungsten and/or aluminum is formed in the contact hole (block 230). The metal wiring makes contact with the underlying conductive layer.

According to some embodiments of the invention, a metal wiring including tungsten is formed using the etch stop layer without a formation of a barrier layer. A recess R (see, for example, FIG. 6) may not be formed at an upper portion of the metal wiring, thereby allowing a reduction in contact failures in the semiconductor device. In other words, formation of the etch stop layer inside the contact beneath the metal wiring is avoided, thereby allowing a reduction in contact failures. In addition, the resistance of the metal wiring may be reduced as shown in FIG. 7. Moreover, in some embodiments according to the invention, the formation of the metal wiring is carried out at a relatively low temperature (of no more than about 450° Centigrade) to allow a reduction in thermal stress.

Figure 3A:
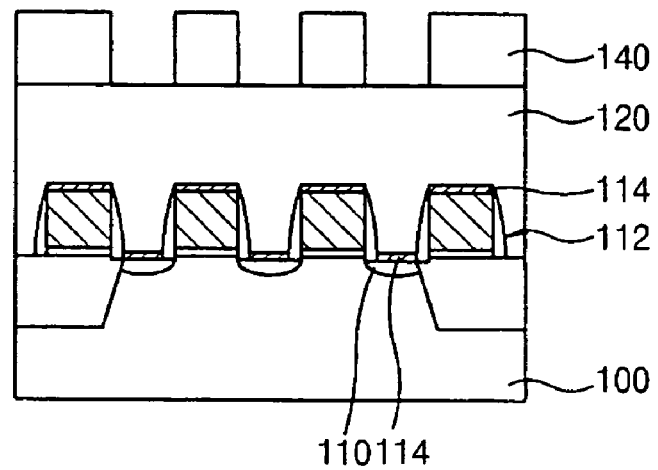
FIGS. 3A to 3F are cross sectional views illustrating methods of forming tungsten contacts in semiconductor devices according to some embodiments of the invention.

FIGS. 3A to 3F are cross sectional views illustrating methods of forming tungsten contacts in semiconductor devices according to some embodiments of the invention. Referring to FIG. 3A, an insulation layer 120 is formed on a semiconductor substrate 100 having transistors formed thereon. The semiconductor substrate 100 is divided into an active region and a field region by an isolation process such as an STI process. The transistor includes gate electrode 112, a nitride spacer and source/drain regions 110. A metal silicide layer 114 is formed on the gate electrode 112 and the source/drain regions 110 of the transistor.

A mask 140 for forming a contact hole 122 is formed on the insulation layer 120. The mask 140 partially exposes the insulation layer 120 where the metal silicide layer 114 on the source/drain regions 110 is positioned. The mask 140 may include a photoresist pattern.

Figure 3B:
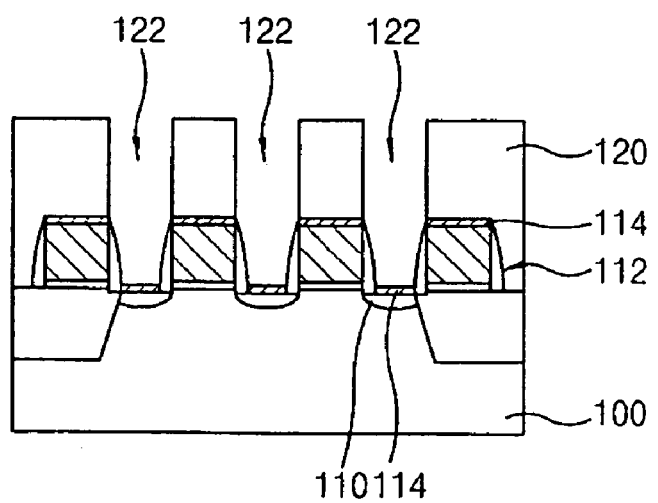

Referring to FIG. 3B, the insulation layer 120 is partially etched using the mask 140 to form the contact hole 122 through the insulation layer 120. The contact hole 122 exposes the metal silicide layer 114 positioned on the source/drain regions 110. The mask 140 is removed from the insulation layer 120 by an ashing process and/or a stripping process.

Figure 3C:
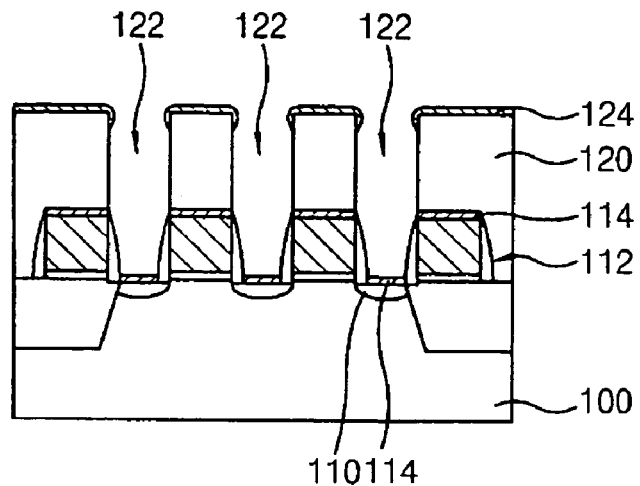

Referring to FIG. 3C, an etch stop layer 124 is selectively formed on the insulation layer 120 outside the contact hole and to avoid forming the etch stop layer 124 inside the contact hole. That is, the etch stop layer 124 is not formed in the contact hole 122. In some embodiments according to the invention, the etch stop layer 124 is formed by sputtering to form a titanium nitride (etch stop) layer to a thickness of no more than about 100 Å measured from an upper face of the insulation layer 120.

Figure 3D:
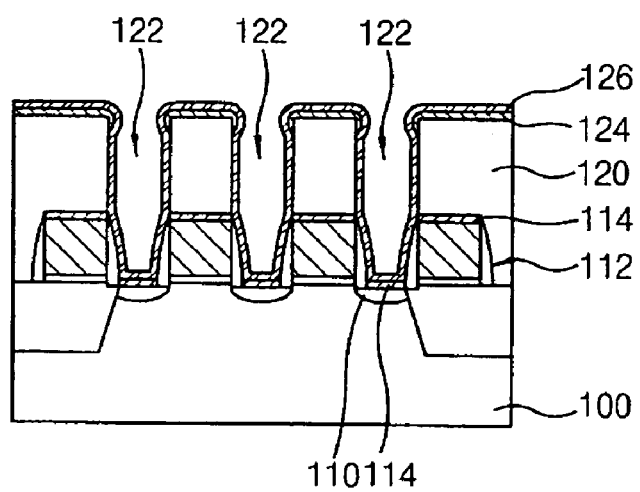

Referring to FIG. 3D, a conductive layer 126 is formed on the etch stop layer 124, on a sidewall of the contact hole 122, and on the metal silicide layer 114. In some embodiments according to the invention, the conductive layer 126 has a thickness of no more than about 100 Å. For example, a tungsten nitride layer (the conductive layer 126) may be deposited on the etch stop layer 124 and inside of the contact hole 122 using ALD at a temperature of no more than about 200° C. to thereby form the conductive layer 126. The conductive layer 126 may allow reduced diffusion of tungsten in a tungsten contact 130 (see FIG. 3F) in the contact hole 122 into the insulation layer 120. The conductive layer 126 may also improve adhesive between the insulation layer 120 and the tungsten contact 130.

Figure 3E:
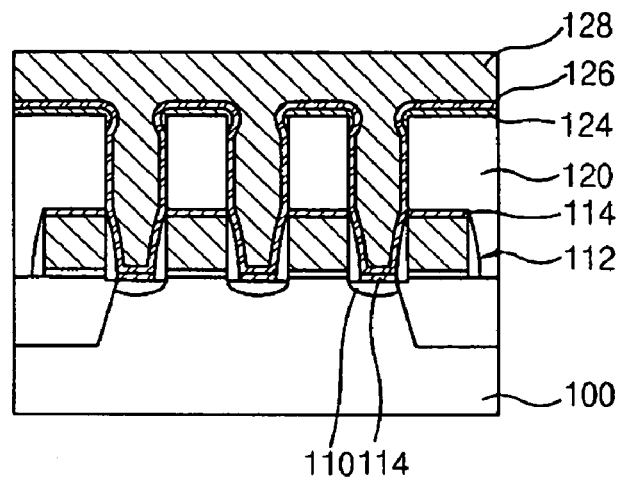

Referring to FIG. 3E, a tungsten layer 128 is formed on the conductive layer 126 by CVD or PVD to fill the contact hole 122. In some embodiments according to the invention, the tungsten layer 128 is formed on the conductive layer 128 by CVD at a temperature of no more than about 450° C.

Figure 3F:
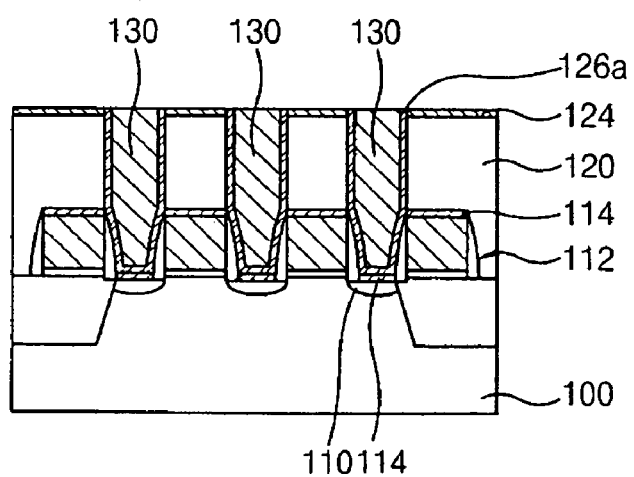

Referring to FIG. 3F, the tungsten layer 128 and the conductive layer 126 positioned on the etching stop layer 124 are anisotropically etched until the etch stop layer 124 is exposed. In some embodiments according to the invention, the tungsten layer 128 and the conductive layer 126 are partially etched using a dry etching process.

Etching is ceased before the etch stop layer 124 is entirely removed from the surface of the insulation layer 120 so that at least a portion of the etch stop layer remains. Thus, a conductive layer pattern 126a is formed on the metal silicide layer 114 and on the sidewall of the contact hole 122. Simultaneously, the tungsten contact 130 is formed on the conductive layer pattern 126a to fill the contact hole 122. The tungsten contact 130 is electrically connected to the metal silicide layer 114.

According to some embodiments of the invention, a metal wiring including tungsten is formed using the etch stop layer without a formation of a barrier layer, a recess R (see, for example, FIG. 6) may not be formed at an upper portion of the metal wiring, thereby allowing a reduction in contact failures in the semiconductor device. In other words, formation of the etch stop layer inside the contact beneath the metal wiring is avoided, thereby allowing a reduction in contact failures. In addition, the resistance of the metal wiring may be reduced as shown in FIG. 7. Moreover, in some embodiments according to the invention, the formation of the metal wiring is carried out at a relatively low temperature (of no more than about 450° Centigrade) to allow a reduction in thermal stress.

Figure 4A:
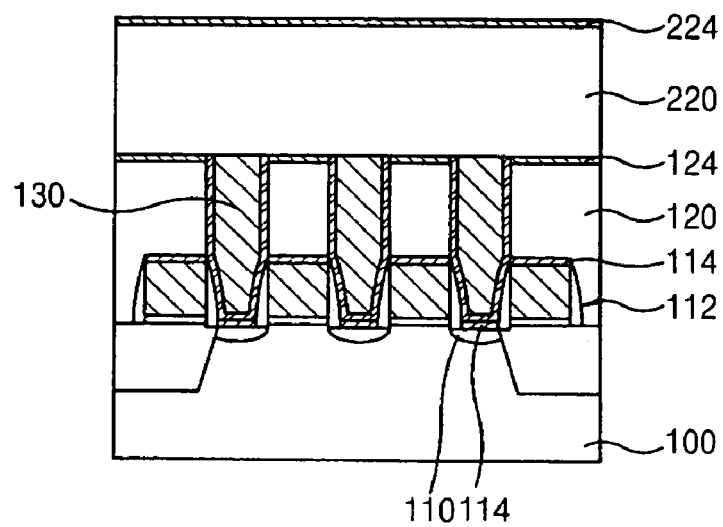
FIGS. 4A to 4E are cross sectional views illustrating methods of forming tungsten pads in a semiconductor device according to some embodiments of the invention.

FIGS. 4A to 4E are cross sectional views illustrating methods of forming tungsten pads in a semiconductor device according to some embodiments of the invention. Referring to FIG. 4A, an insulation interlayer 220 is formed on the substrate 100 to cover the tungsten contact 130 and the (first) etch stop layer 124 of FIG. 3F.

Figure 4B:
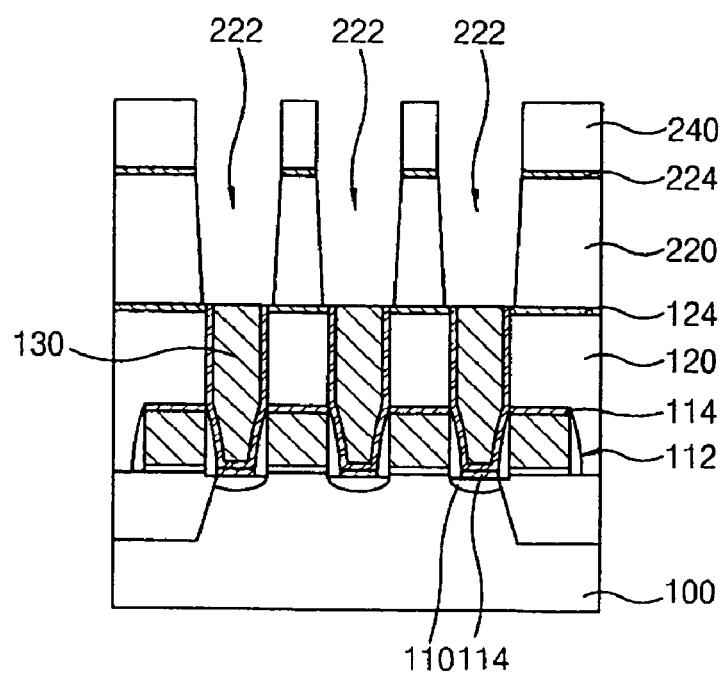

A titanium nitride layer 224 serving as a second etch stop layer is formed on the insulation interlayer 220 by a sputtering process. In some embodiments according to the invention, the titanium nitride layer 224 has a thickness of no more than about 100 Å. Referring to FIG. 4B, a mask 240 for forming a second contact hole 222 through the insulation interlayer 220 is formed on the titanium nitride layer 224. The mask 240 partially exposes the titanium nitride layer 224 where the tungsten wiring 130 is positioned. The mask 240 may include a photoresist pattern.

The titanium nitride layer 224 and the insulation interlayer 220 are etched using the mask 240 until the tungsten contact 130 is exposed, thereby forming the second contact hole 222. In some embodiments according to the invention, the titanium nitride layer 224 and the insulation interlayer 220 are etched by a dry etching process.

Figure 4C:
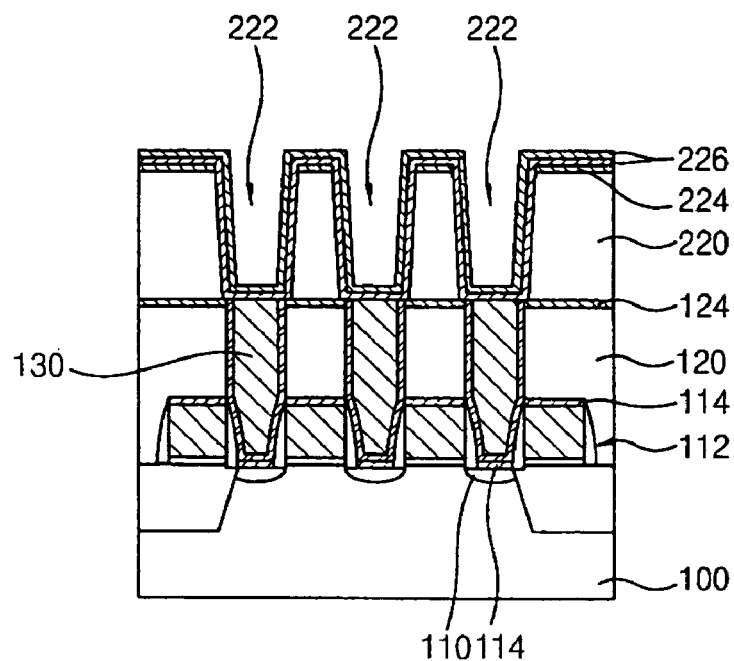

Referring to FIG. 4C, the mask 240 is removed from the titanium nitride layer 224 by an ashing process and/or a stripping process. A second conductive layer 226 is formed on the tungsten contact 130, on a sidewall of the second contact hole 222 and on the titanium nitride layer 224 (i.e., the second etch stop layer). The second conductive layer 226 may prevent tungsten (atoms or ions) of a tungsten pad 230 (see FIG. 4E) in the second contact hole 222 from diffusing into the insulation interlayer 220. The second conductive layer 226 may also improve adhesion between the insulation interlayer 220 and the tungsten pad 230.

In some embodiments according to the invention, the second conductive layer 226 includes tungsten nitride, tungsten/tungsten nitride, etc. In some embodiments according to the invention, the second conductive layer 226 is formed by CVD or ALD at a low temperature. The second conductive layer 226 can be a double layer structure including a tungsten film and a tungsten nitride film. In some embodiments according to the invention, the tungsten film and the tungsten nitride film are formed on the titanium nitride layer 224 by the ALD.

Figure 4D:
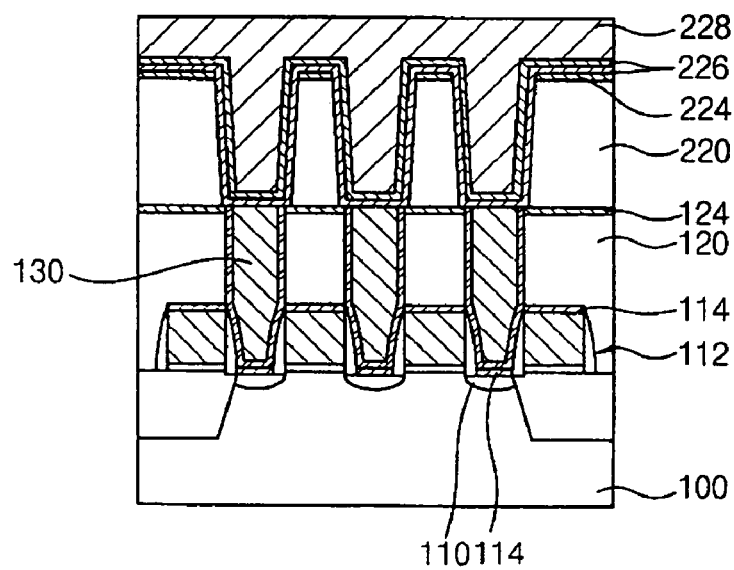

Referring to FIG. 4D, a second tungsten layer 228 is formed on the second conductive layer 226 by CVD or PVD to fill the second contact hole 222. In some embodiments according to the invention, the tungsten layer 228 is formed at a temperature of no more than about 450° C.

Figure 4E:
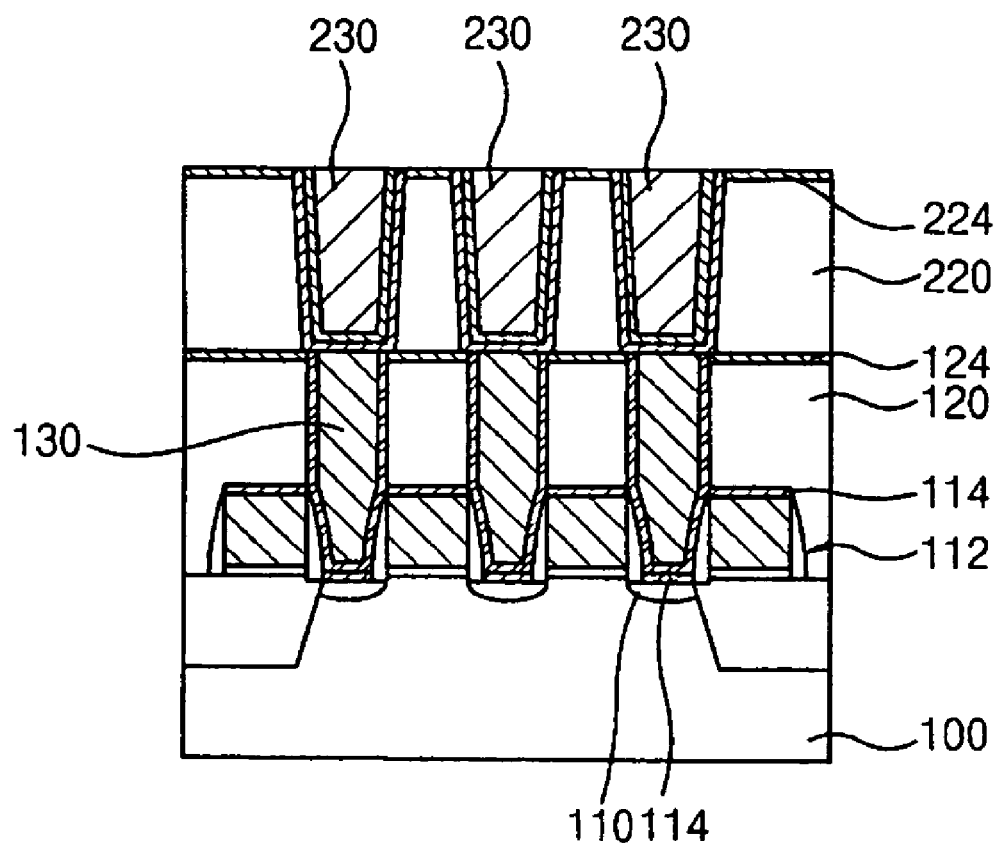

Referring to FIG. 4E, the second tungsten layer 228 and the second conductive layer 226 are anisotropically etched until the titanium nitride layer 224 (the second etch stop layer) is exposed to thereby form the tungsten pad 230 in the contact hole 222. Etching is ceased before the titanium nitride layer 224 is entirely removed from the surface of the insulation interlayer 220 so that at least a portion of the titanium nitride layer 224 remains. The tungsten pad 230 is electrically connected to the tungsten contact 130. The second tungsten layer 228 and the second conductive layer 226 are partially etched by a dry etching process.

Figure 6:
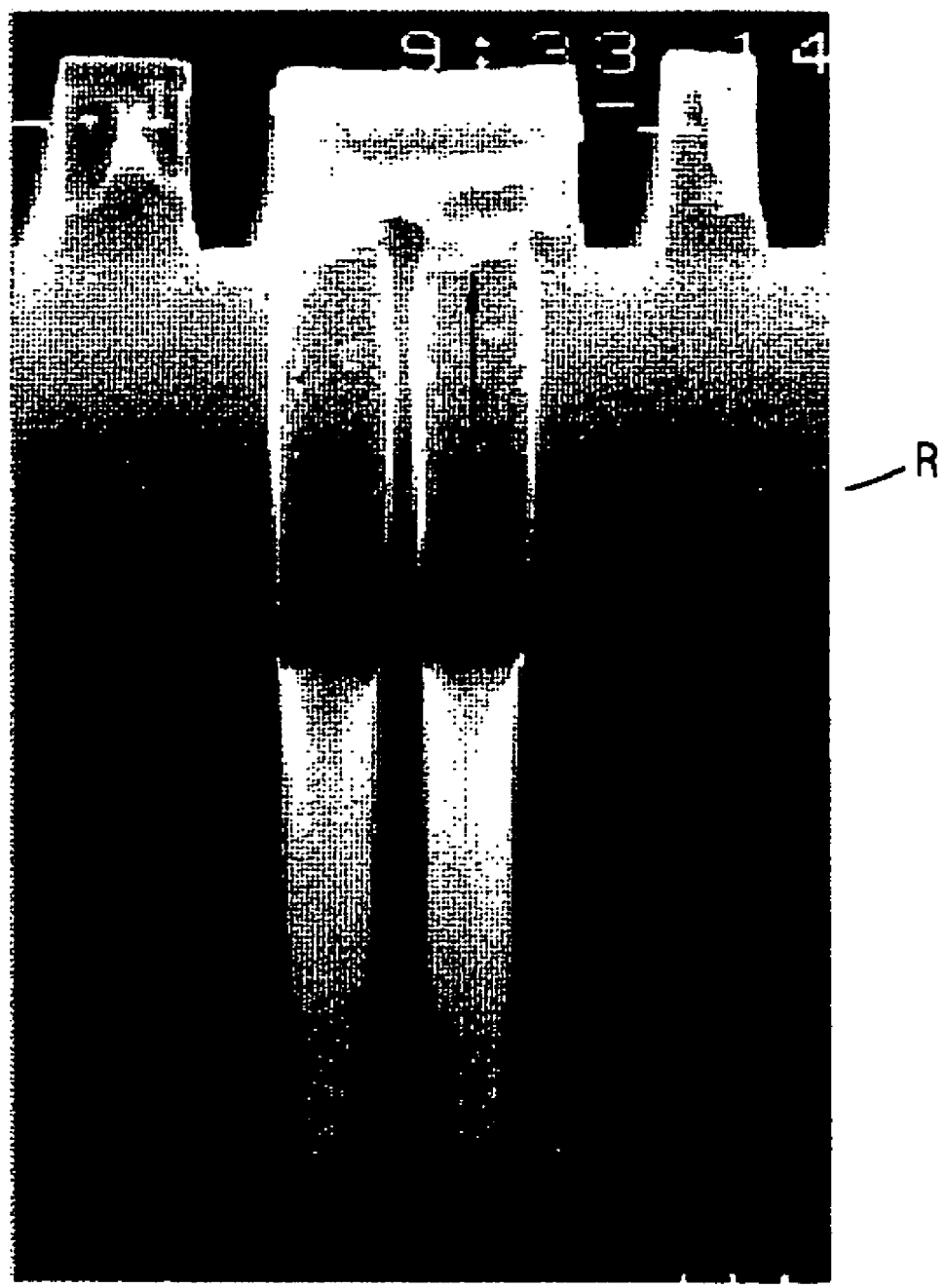
FIG. 6 is a electron microscopic picture showing damage to metal wiring without a formation of an etch stop layer.
Figure 7:
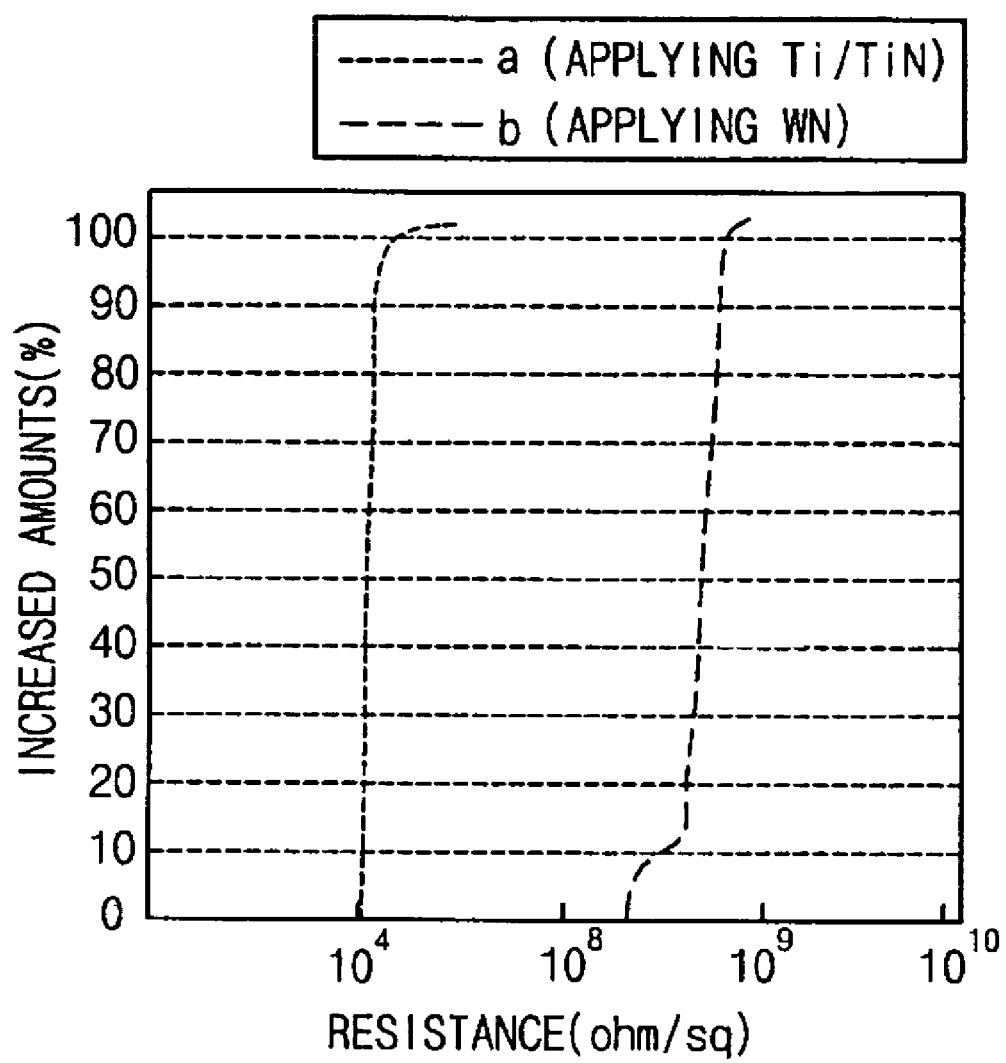
FIG. 7 is a graph illustrating resistances of metal wiring formed by employing a titanium nitride layer and a barrier layer, respectively.

According to the present embodiment, since a metal pad is formed using the etch stop layer without a formation of a barrier layer, the recess R shown in FIG. 6 may not be formed at an upper portion of the metal pad, thereby allowing a reduction in contact failures. Also, the resistance of the metal pad shown in FIG. 7 may be reduced. Moreover, the process for forming the metal pad may be carried out at a low temperature of no more than about 450° so that a failure of a semiconductor device due to a thermal stress may be reduced/prevented.

Figure 5A:
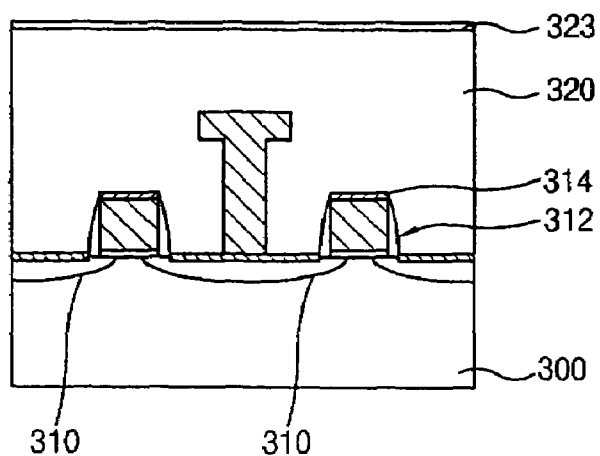
FIGS. 5A to 5F are cross sectional views illustrating methods of forming metal wiring in a semiconductor device according to some embodiments of the invention.

FIGS. 5A to 5F are cross sectional views illustrating methods of forming metal wiring in semiconductor devices according to some embodiments of the invention. Referring to FIG. 5A, an insulation interlayer 320 is formed on a semiconductor substrate 300 having conductive structures including transistors. Each of the transistors includes a gate electrode 312, a nitride spacer and source/drain regions 310. The transistors may be positioned in a peripheral region of the substrate 300 eexpect a cell region of the substrate 300. The conductive structures also include metal silicide layers 314 formed on the gate electrode 312 and the source/drain regions 310. In some embodiments according to the invention, the metal silicide layer 314 includes tungsten silicide, cobalt silicide, etc.

A titanium nitride layer 324 serving as an etch stop layer is formed on the insulation interlayer 320. In some embodiments according to the invention, the titanium nitride layer 324 has a thickness of no more than about 100 Å. In some embodiments according to the invention, a titanium layer 323 is formed on the insulation interlayer 320 by CVD or a sputtering process at a low temperature.

Figure 5B:
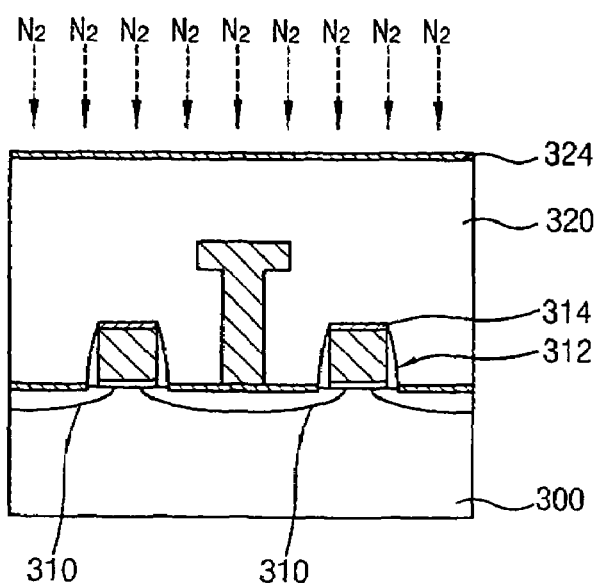

Referring to FIG. 5B, a nitrogen gas or an ammonia gas is introduced in-situ or ex-situ onto the titanium layer 323 to change the titanium layer 323 into the titanium nitride layer 324.

Figure 5C:
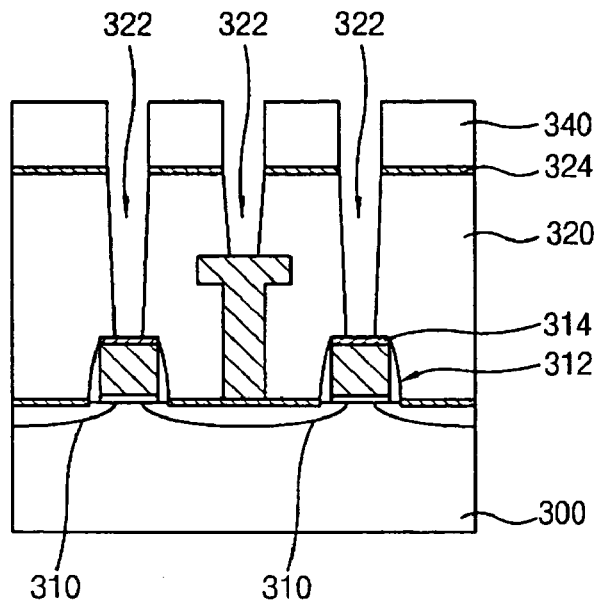

Referring to FIG. 5C, a mask 340 for forming a contact hole 322 is formed on the titanium nitride layer 324. The mask 340 partially exposes the titanium nitride layer 324 where the metal silicide layer 314 formed on the gate electrode 312 is positioned. The mask 340 may include a photoresist pattern.

The titanium nitride layer 324 and the insulation interlayer 320 are partially etched using the mask 340 to thereby form the contact hole 322 that exposes the metal silicide layer 314. The mask 340 is removed from the titanium nitride layer 324 by an ashing process and/or a stripping process.

Figure 5D:
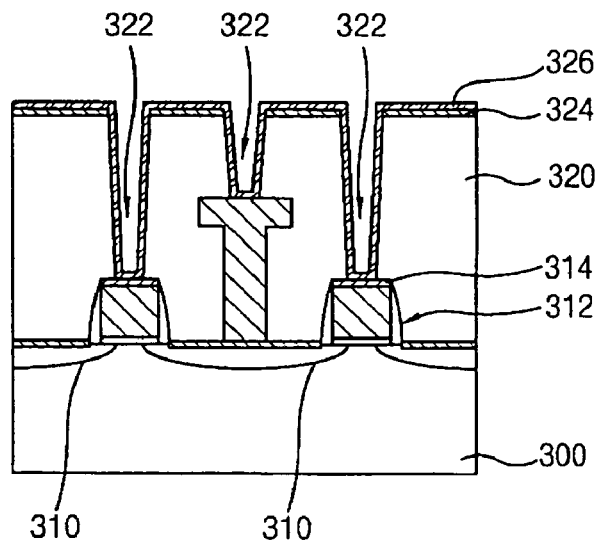

Referring to FIG. 5D, a conductive layer 326 is formed on the metal silicide layer 314, on a sidewall of the contact hole 322 and on the titanium nitride 324 outside the contact hole 322. As described above, the conductive layer 326 prevents tungsten (atoms or ions) in a tungsten wiring 330 formed in the contact hole 322 (see FIG. 5F) from diffusing into the insulation interlayer 320. The conductive layer 326 enhances an adhesive strength between the insulation interlayer 320 and the tungsten wiring 330. The conductive layer 326 may include a tungsten nitride film, tungsten/tungsten nitride films, etc. The tungsten nitride film or the tungsten/tungsten nitride films may be formed at a low temperature by a CVD process or an ALD process. For example, the conductive layer 326 of the present embodiment includes the tungsten nitride film formed by the ALD process.

Figure 5E:
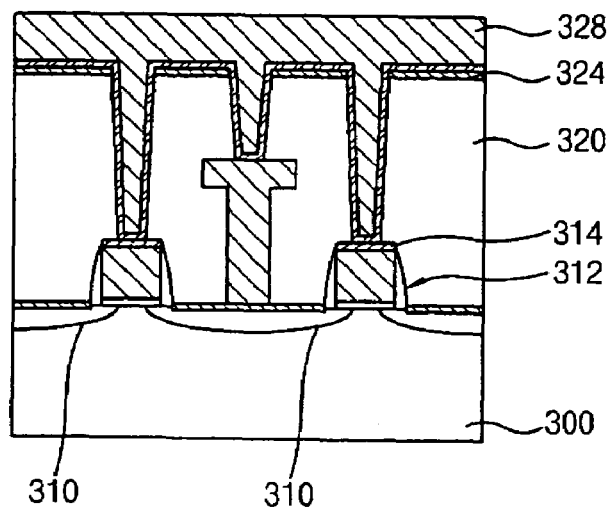

Referring to FIG. 5E, a tungsten layer 328 is formed on the conductive layer 326 by CVD or PVD to fill the contact hole 322. For example, the tungsten layer 328 can be formed at a temperature of no more than about 450° C.

Figure 5F:
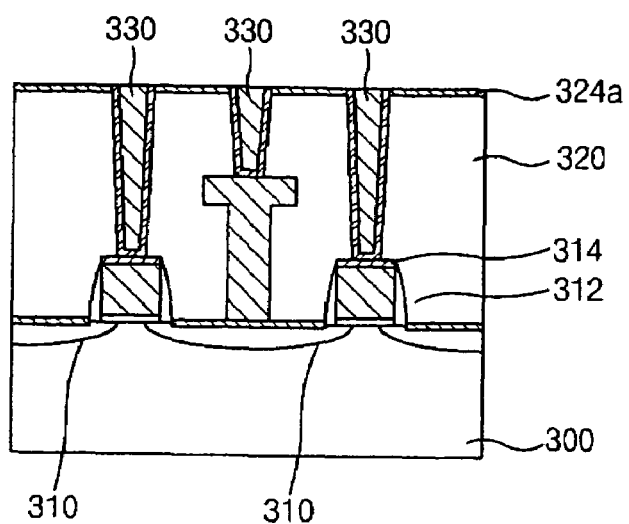

Referring to FIG. 5F, portions of the tungsten layer 328 and the conductive layer 326 are anisotropically etched until the titanium nitride layer 324 is exposed. Etching is ceased before the titanium nitride layer 324 is entirely removed from the surface of the insulation interlayer 320 so that at least a portion of the titanium nitride layer 324 remains. The tungsten layer 328 and the conductive layer 326 may be partially etched by a dry etching process. Thus, the tungsten wiring 330 is formed in the contact hole 322. The tungsten wiring 330 is electrically connected to the metal silicide layer 314.

According to some embodiments of the invention, metal wiring is formed at a temperature of no more than about 450° C. using the etch stop layer without the formation of a barrier layer so that the metal wiring may have improved electrical characteristics and a failure of the semiconductor device due to a thermal stress may be reduced/prevented. Further, the etch stop layer is selectively used so that an etching endpoint in the etching process for etching a metal layer may be accurately detected. Therefore, a recess may not be formed at an upper portion of the metal wiring during etching the metal layer, thereby reducing a contact failure of the metal wiring.

Many alterations and modifications may be made by those having ordinary skill in the art, given the benefit of the present disclosure, without departing from the spirit and scope of the invention. Therefore, it must be understood that the illustrated embodiments have been set forth only for the purposes of example, and that it should not be taken as limiting the invention as defined by the following claims. The following claims are, therefore, to be read to include not only the combination of elements which are literally set forth but all equivalent elements for performing substantially the same function in substantially the same way to obtain substantially the same result. The claims are thus to be understood to include what is specifically illustrated and described above, what is conceptually equivalent, and also what incorporates the essential idea of the invention.

What is claimed is:

1. A method of forming a metal wiring in a semiconductor device comprising:
   forming a contact hole in an insulation layer after forming the contact hole, forming an etch stop layer outside the contact hole in the insulation layer and avoiding forming the etch stop layer inside the contact hole;
   forming a conductive layer on the etch stop layer outside the contact hole and on an exposed conductive pattern inside the contact hole and on a sidewall of the contact hole; and
   forming a metal layer on the conductive layer to fill the contact hole.

2. A method according to claim 1, wherein forming the etch stop layer comprises forming a titanium/titanium nitride layer, a titanium nitride layer, a tantalum/tantalum nitride layer, a tantalum nitride layer, a zirconium nitride layer and/or a hafnium nitride layer.

3. A method according to claim 1, wherein forming the etch stop layer comprises forming a Titanium Nitride layer.

4. A method according to claim 3, wherein forming the titanium nitride -layer comprises:
   providing a nitrogen gas to a titanium layer to nitride the titanium layer.

5. A method according to claim 1, wherein forming the etch stop layer, forming the conductive layer and forming the metal layer are performed at a temperature of no more than about 450° Centigrade.

6. A method according to claim 1, wherein forming the etch stop layer outside the contact hole in the insulation layer and avoiding forming the etch stop layer inside the contact hole further comprises:
   forming the etch stop layer outside the contact hole and forming a portion of the etch stop layer inside the contact hole of a sidewall thereof proximate to an opening of the contact hole and avoiding forming the etch stop layer at a bottom of the contact hole; and
   removing the portion of the etch stop layer from inside the contact hole.

7. A method according to claim 1, wherein forming the conductive layer comprises forming a Tungsten layer.

8. A method according to claim 1, wherein the insulation layer comprises a first insulation layer, the etch stop layer comprises a first etch stop layer, the conductive layer comprises a first conductive layer, and the metal layer comprises a first metal layer, the method further comprising:
   forming a second insulation layer on the first metal layer having a pad hole formed therein exposing the first metal layer;
   forming a second etch stop layer outside the pad hole and avoiding forming the second etch stop layer inside the pad hole;

forming a second conductive layer on the second etch stop layer outside the contact hole and on the exposed first metal layer inside the pad hole and on a sidewall of the pad hole; and forming a second metal layer on the second conductive layer to fill the pad hole.

9. A method according to claim 8, further comprising:

removing the second metal layer from the second insulation layer to expose the second etch stop layer and to leave a remaining portion of the second etch stop layer on the second insulation layer.

10. A method according to claim 8, wherein forming the second etch stop layer comprises forming a titanium/titanium nitride layer, a titanium nitride layer, a tantalum/tantalum nitride layer, a tantalum nitride layer, a zirconium nitride layer and/or a hafnium nitride layer.

11. A method according to claim 8, wherein forming the second etch stop layer, forming the second conductive layer and forming the second metal layer are performed at a temperature of no more than about 450° Centigrade.

12. A method according to claim 1, further comprising:

partially removing the metal layer from the insulation layer to expose the etch stop layer and to leave a remaining portion of the etch stop layer on the insulation layer.

13. A method according to claim 1 wherein the etch stop layer comprises a first metal nitride, and wherein the conductive layer comprises a second metal nitride different than the first metal nitride.

14. A method according to claim 1 wherein the etch stop layer comprises titanium nitride, wherein the conductive layer comprises tungsten nitride, and wherein the metal layer comprises tungsten.

15. A method of forming a metal wiring in a semiconductor device comprising:

forming a first insulation layer on a substrate;

forming a contact hole in the first insulation layer to expose a source/drain region in the substrate;

after forming said contact hole, forming a first etch stop layer outside the contact hole and avoiding forming the first etch stop layer inside the contact hole;

forming a first conductive layer on the first etch stop layer outside the contact hole and on an exposed conductive pattern inside the contact hole and on a sidewall of the contact hole;

forming a first metal layer on the first conductive layer to fill the contact hole;

forming a second insulation layer on the first metal layer having a pad hole formed therein exposing the first metal layer;

forming a second etch stop layer outside the pad hole and avoiding forming the second etch stop layer inside the pad hole;

forming a second conductive layer on the second etch stop layer outside the contact hole and on the exposed first metal layer inside the pad hole and on a sidewall of the pad hole; and forming a second metal layer on the second conductive layer to fill the pad hole.

16. A method according to claim 15, further comprising:

removing the second metal layer from the second insulation layer to expose the second etch stop layer and to leave a remaining portion of the second etch stop layer on the second insulation layer.

17. A method according to claim 15, wherein forming the second etch stop layer comprises forming a titanium/titanium nitride layer, a titanium nitride layer, a tantalum/tantalum nitride layer, a tantalum nitride layer, a zirconium nitride layer and/or a hafnium nitride layer.

18. A method according to claim 15, wherein forming the second etch stop layer, forming the second conductive layer and forming the second metal layer are performed at a temperature of no more than about 450° Centigrade.

19. A method of forming a metal wiring in a semiconductor device comprising:

providing an insulation layer on a substrate so that a conductive pattern is between the insulation layer and the substrate;

forming a contact hole through the insulation layer exposing a portion of the conductive pattern;

after forming the contact hole, forming an etch stop layer on the insulating layer opposite the substrate and outside the contact hole so that portions of a sidewall inside the contact hole are free of the etch stop layer;

after forming the etch stop layer, forming a conductive layer on the etch stop layer outside the contact hole and on the conductive pattern inside the contact hole and on the sidewall of the contact hole; and forming a metal layer on the conductive layer to fill the contact hole.

20. A method according to claim 19, wherein forming the etch stop layer comprises forming a Titanium Nitride layer.

21. A method according to claim 20, wherein forming the titanium nitride -layer comprises:

providing a nitrogen gas to a titanium layer to nitride the titanium layer.

22. A method according to claim 19, wherein forming the conductive layer comprises forming a Tungsten layer.

23. A method according to claim 19, wherein the insulation layer comprises a first insulation layer, the etch stop layer comprises a first etch stop layer, the conductive layer comprises a first conductive layer, and the metal layer comprises a first metal layer, the method further comprising:

forming a second insulation layer on the first metal layer having a pad hole formed therein exposing the first metal layer;

forming a second etch stop layer outside the pad hole and avoiding forming the second etch stop layer inside the pad hole;

forming a second conductive layer on the second etch stop layer outside the contact hole and on the exposed first metal layer inside the pad hole and on a sidewall of the pad hole; and forming a second metal layer on the second conductive layer to fill the pad hole.

24. A method according to claim 19, further comprising:

partially removing the metal layer from the insulation layer to expose the etch stop layer and to leave a remaining portion of the etch stop layer on the insulation layer.

* * * * *